(12) United States Patent
Huang

(10) Patent No.: US 7,948,773 B2
(45) Date of Patent: May 24, 2011

(54) ELECTROMAGNETIC INTERFERENCE SHIELDING DEVICE

(75) Inventor: Chin-Wen Huang, Taipei Hsien (TW)

(73) Assignee: Hon Hai Precision Industry Co., Ltd., Tu-Cheng, New Taipei (TW)

( * ) Notice: Subject to any disclaimer, the term of this patent is extended or adjusted under 35 U.S.C. 154(b) by 0 days.

(21) Appl. No.: 12/533,009

(22) Filed: Jul. 31, 2009

(65) Prior Publication Data

US 2010/0046192 A1    Feb. 25, 2010

(30) Foreign Application Priority Data

Aug. 20, 2008   (CN) .......................... 2008 1 0304115

(51) Int. Cl.
*H05K 9/00* (2006.01)
(52) U.S. Cl. .................... 361/818; 361/816; 361/799
(58) Field of Classification Search .................. 361/816, 361/818, 799, 794, 679.01, 715, 748, 752, 361/753, 784, 796, 800; 439/55, 76.1, 92, 439/607.1, 527, 544, 552, 554; 174/50, 51, 350, 351, 363, 366, 370, 377, 384, 387, 388
See application file for complete search history.

(56) References Cited

U.S. PATENT DOCUMENTS

| 5,596,487 | A | * | 1/1997 | Castaneda et al. ............. 361/814 |
| 6,065,980 | A | * | 5/2000 | Leung et al. ..................... 439/92 |
| 6,231,109 | B1 | * | 5/2001 | Beaver .......................... 296/97.9 |
| 6,359,215 | B1 | * | 3/2002 | Horng ............................ 174/367 |
| 6,538,197 | B1 | * | 3/2003 | Kawai ............................ 174/363 |

* cited by examiner

*Primary Examiner* — Hung S Bui
(74) *Attorney, Agent, or Firm* — Zhigang Ma

(57) ABSTRACT

An electromagnetic interference shielding device includes a printed circuit board, a metal member and an elastic member. The elastic member includes a first resisting portion which contacts the printed circuit board and a second resisting portion which contacts the metal member, and the second resisting portion is saw-toothed, and is capable of piercing an oxidized layer of the metal member. Thus, the elastic member keeps contacting the metal member maximally no matter the metal member is oxidized or not, and reduces the electromagnetic interference effectively.

8 Claims, 1 Drawing Sheet

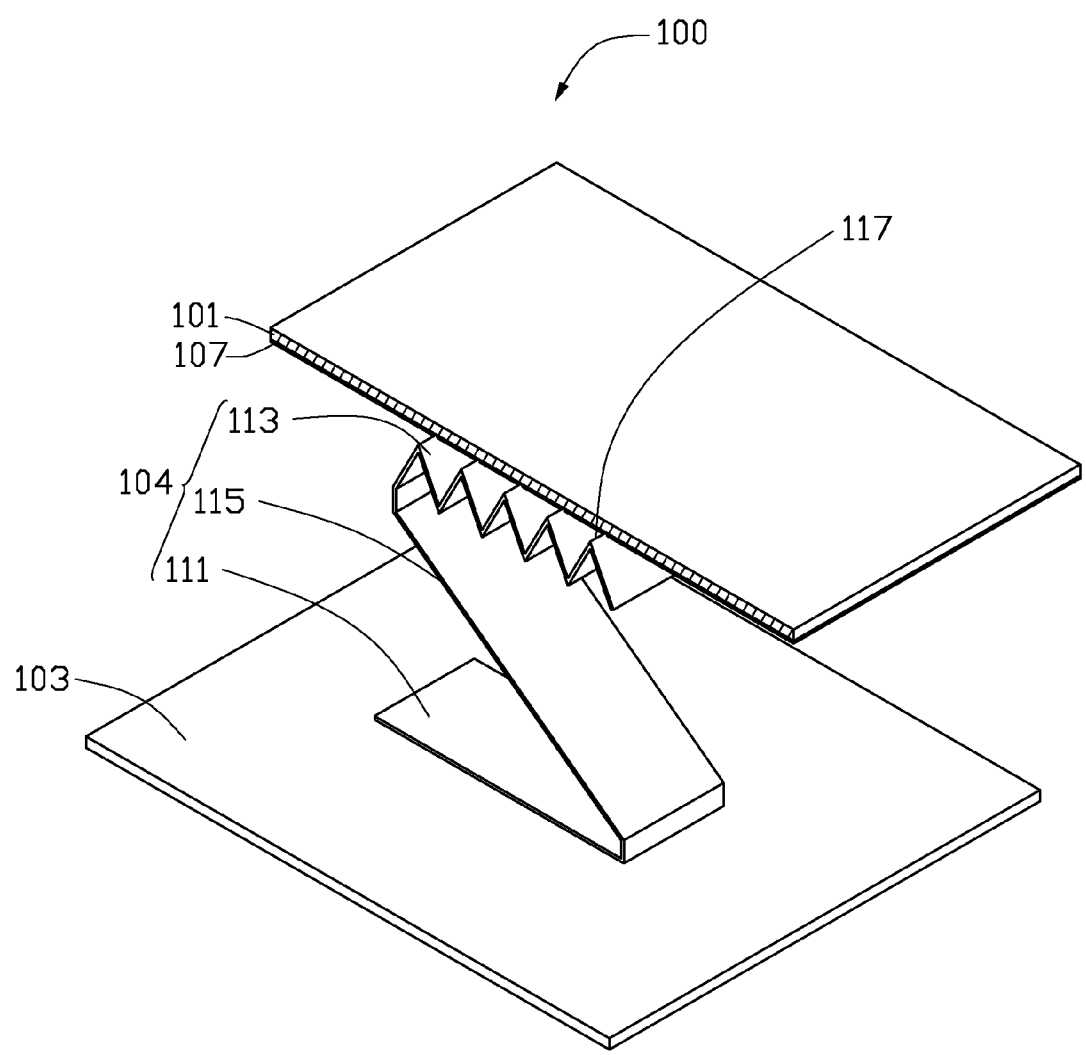

ELECTROMAGNETIC INTERFERENCE SHIELDING DEVICE

BACKGROUND

1. Technical Field

The disclosure relates to a device capable of reducing electromagnetic interference.

2. Description of Related Art

As is known, printed circuit boards (PCB) radiate electromagnetic interference. To reduce electromagnetic interference, one method is to use an elastic member located on the PCB to contact with a metal shield casing containing the PCB. When the elastic member of the PCB contacts the metal shield casing, the contact resistance between the PCB and the metal shield casing decreases and reduces the electromagnetic interference.

However, the metal shield casing is easily oxidized and as a result, decreases the contact area between the elastic member and the metal shield casing. The resistance increases as the contact area decreases and attenuates the electromagnetic interference shield.

Therefore, it is desirable to provide a device to overcome the described limitations.

BRIEF DESCRIPTION OF THE DRAWING

The components in the drawing are not necessarily drawn to scale, the emphasis instead being placed upon clearly illustrating the principles of the device.

The drawing is an isometric view of a device capable of reducing electromagnetic interference according to an exemplary embodiment.

DETAILED DESCRIPTION

Referring to the drawing, an electromagnetic interference shielding device 100, includes a metal member 101, a printed circuit board (PCB) 103 which is placed parallel with the metal member 101, and an elastic member 104 which is elastically compressed between the metal member 101 and the PCB 103. In the embodiment, the metal member 101 is a metal shield casing.

In the embodiment, the elastic member 104 has a "Z" shape, the elastic member 104 includes a first resisting portion 111, a second resisting portion 113, and a connecting portion 115 connecting the first resisting portion 111 to the second resisting portion 113. The first resisting portion 111 contacts the PCB 103. The second resisting portion 113 is shaped saw-toothed and teeth 117 contact the metal member 101. If the metal member 101 becomes oxidized and an oxidation layer 107 is formed on it, the teeth 117 are capable of piercing the oxidation layer 107 and thus maintain adequately contact with the metal member 101. As a result, the contact area between the second resisting portion 113 with the metal member 101 is maintained and not influenced by oxidation. As is known, the contact resistance value R between the PCB 103 and the metal member 101 is figured out by an expression $\rho L/S$, in the embodiment, p is electrical resistivity, L is the length of the second resisting portion 113, and S is the contact area between the second resisting portion 113 and the metal member 101, therefore, on condition that the length of the second resisting portion 113 keeps a constant value, the contact resistance value is not decreased because the contact area S is not decreased. Therefore, by using a saw-toothed structure to contact with the metal member 101, the contact area between the second resisting portion 113 and the metal member 101 is kept stable no matter the metal member 101 is oxidized or not, the metal member 101 can prevent the electromagnetic interference effectively.

In the embodiment, the connecting portion 115 is slanted between the first resisting portion 111 and the second resisting portion 113. The elastic member 104 is elastically compressed and is capable of resuming its original shape when depression applied to it is released. Therefore, the second resisting portion 113 contacts with the metal member 101 completely.

In order to reduce electromagnetic interference, a plurality of elastic members 104 can be connected between the metal member 101 and the PCB 103. In the embodiment, only one elastic member 104 is shown to illustrate the present disclosure. Through the elastic member 104, electromagnetic interference of the PCB 103 is reduced and possible harm to human bodies is reduced accordingly.

It is believed that the present embodiments and their advantages will be understood from the foregoing description, and it will be apparent that various changes may be made thereto without departing from the spirit and scope of the disclosure or sacrificing all of its material advantages, the examples hereinbefore described merely being preferred or exemplary embodiments of the present disclosure.

What is claimed is:

1. An electromagnetic interference shielding device, comprising:
   a metal member in a shape of a shield casing; and
   an elastic member compressed between the metal member and a printed circuit board (PCB), wherein, the elastic member comprises:
   a first resisting portion contacting with the PCB;
   a second resisting portion comprising a saw-toothed part, the saw-toothed part contacting with the metal member; and
   a connecting portion connecting the first resisting portion to the second resisting portion.

2. The electromagnetic interference shielding device of claim 1, wherein the elastic member is "Z" shaped.

3. The electromagnetic interference shielding device of claim 1, wherein the metal member is parallel to the PCB, and the first resisting portion is parallel to the second resisting portion and the connecting portion is slanted between the metal board and the PCB.

4. The electromagnetic interference shielding device of claim 1, wherein the metal member is a metal shield casing.

5. An electromagnetic interference shielding assembly, comprising:
   a printed circuit board (PCB);
   a metal member in a shape of a shield casing; and
   an elastic member compressed between the metal member and the PCB, wherein, the elastic member comprises:
   a first resisting portion contacting with the PCB;
   a second resisting portion comprising a saw-toothed part, the saw-toothed part contacting with the metal member; and
   a connecting portion connecting the first resisting portion to the second resisting portion.

6. The electromagnetic interference shielding assembly of claim 5, wherein the elastic member is "Z" shaped.

7. The electromagnetic interference shielding assembly of claim 5, wherein the metal member is parallel to the PCB, and the first resisting portion is parallel to the second resisting portion and the connecting portion is slanted between the metal board and the PCB.

8. The electromagnetic interference shielding assembly of claim 5, wherein the metal member is a metal shield casing.

* * * * *